United States Patent

Adams et al.

[11] Patent Number: 5,707,052
[45] Date of Patent: Jan. 13, 1998

[54] SYSTEM FOR SUPPORTING A PRINTED CIRCUIT BOARD DURING ASSEMBLY

[75] Inventors: Dale R. Adams, Margate; Anthony J. Suppelsa, Coral Springs; Michael Valdez, Plantation, all of Fla.

[73] Assignee: Motorola, Inc., Schaumburg, Ill.

[21] Appl. No.: 703,123

[22] Filed: Aug. 26, 1996

[51] Int. Cl.$^6$ ..................................... B25B 11/00
[52] U.S. Cl. .................. 269/22; 269/20; 269/903
[58] Field of Search ................. 269/20, 22, 903, 269/287, 288; 156/654.1

[56] References Cited

U.S. PATENT DOCUMENTS

| | | | |
|---|---|---|---|
| 4,459,743 | 7/1984 | Watanabe et al. | 29/740 |
| 4,687,189 | 8/1987 | Stoll et al. | 269/22 |
| 5,450,996 | 9/1995 | Helton et al. | 269/22 |
| 5,578,167 | 11/1996 | Sooriakumar et al. | 269/903 |

*Primary Examiner*—Robert C. Watson
*Attorney, Agent, or Firm*—Dale W. Dorinski

[57] ABSTRACT system of helically coiled air hoses (18) supports a printed circuit board (14) in an assembly station, and allows the conveyor rails (15, 16) to adjust in and out, accommodating various widths of printed circuit boards (PCB). One of the conveyor rails is fixed and the other is movable. Air hoses are each formed in a helix and placed below the PCB and above the upper work surface of the assembly station, and arranged so that when the air hoses are pressurized the helix expands in diameter to become wedged between the work surface and the PCB to support it from below. One end of each of the air hoses is connected to the fixed rail and the other end is connected to the movable rail. The hoses are sufficiently flexible so as to be free to move about in a lateral direction, but they are diametrically rigid to prevent the diameter of each hose from changing substantially when the hoses are pressurized. The individual coils of the helix can be easily deflected by any protruding components on the bottom side of a printed circuit assembly as it shuttles into the assembly station. When the hoses are pressurized, the coils stiffen to support the PCB from the bottom, substantially preventing deformation of the PCB when a force is exerted upon it from above.

8 Claims, 2 Drawing Sheets

SYSTEM FOR SUPPORTING A PRINTED CIRCUIT BOARD DURING ASSEMBLY

TECHNICAL FIELD

This invention relates in general to assembly equipment for printed circuit boards and more particularly to a supporting mechanism for printed circuit boards for use during assembly of components onto the printed circuit board.

BACKGROUND

Electronic components are typically added to a printed circuit board either by manually placing the pans on the printed circuit board (PCB) or by using a machine such as a robot or a high-speed chip placement machine (a chip shooter) to deposit the parts either on the surface of the board or in plated through holes. In either case, the board must be located somewhere within a work space and fixed at that location during the assembly sequence. The board must also be supported from below during that time, since parts are typically added to the top surface of the printed circuit board. Regardless of which method of component assembly is used, the force of either the human hand or the machine when placing components on the circuit board causes the circuit board to deflect downward. In cases where there are no components on the bottom side of the printed circuit board, that is, the bottom side is flat and planar, supporting the underside of the board is a trivial matter. The board is merely set on a flat stable plane which adequately supports the board across the entire length and width.

However, in situations where there are components on the bottom side of the board, or when the board has an otherwise three-dimensional shape as in molded plastic printed circuit boards, the problem of supporting the circuit board becomes more complex. Larger printed circuit boards are particularly prone to flexing and deformation. One prior art solution to this problem has been to create a customized nest for each model of printed circuit board. This customized nest has supporting points strategically located to match the topography of the bottom side of the individual board. However, this solution requires a unique, customized nest for each size and variety of printed circuit assembly.

Another solution in the prior art is to support the printed circuit board over a regularly spaced matrix of pins. The intent is that by placing the pins at strategic locations, the matrix can accommodate more than one type of printed circuit board. However, this solution also has limited application. A third solution is to have a variety of programmable pins in the supporting nest, such that the height of the pins is controlled by a computer. Thus, when a particular circuit board enters the workstation, the machine is programmed to raise or lower selected pins so that a customized support system is created for every single variety of printed wiring assembly. However, the drawback of this solution is that the hardware and software required to implement this is extremely complex and expensive, and still does not provide total flexibility.

In automated assembly systems where the width of the transporting conveyors can be changed in order to accommodate various sized printed circuit boards, the problem of support becomes even more acute. Any automated assembly system that functions on the principle of "a batch of one" will have a bottleneck wherever a printed circuit board is required to be supported because there is currently no workable solution for the problem of supporting various sizes and varieties of printed circuit board assemblies from the underside during the component assembly process. A solution to this problem would provide a much needed benefit to the electronics industry.

DETAILED DESCRIPTION OF THE PREFERRED EMBODIMENT

Figure 1:
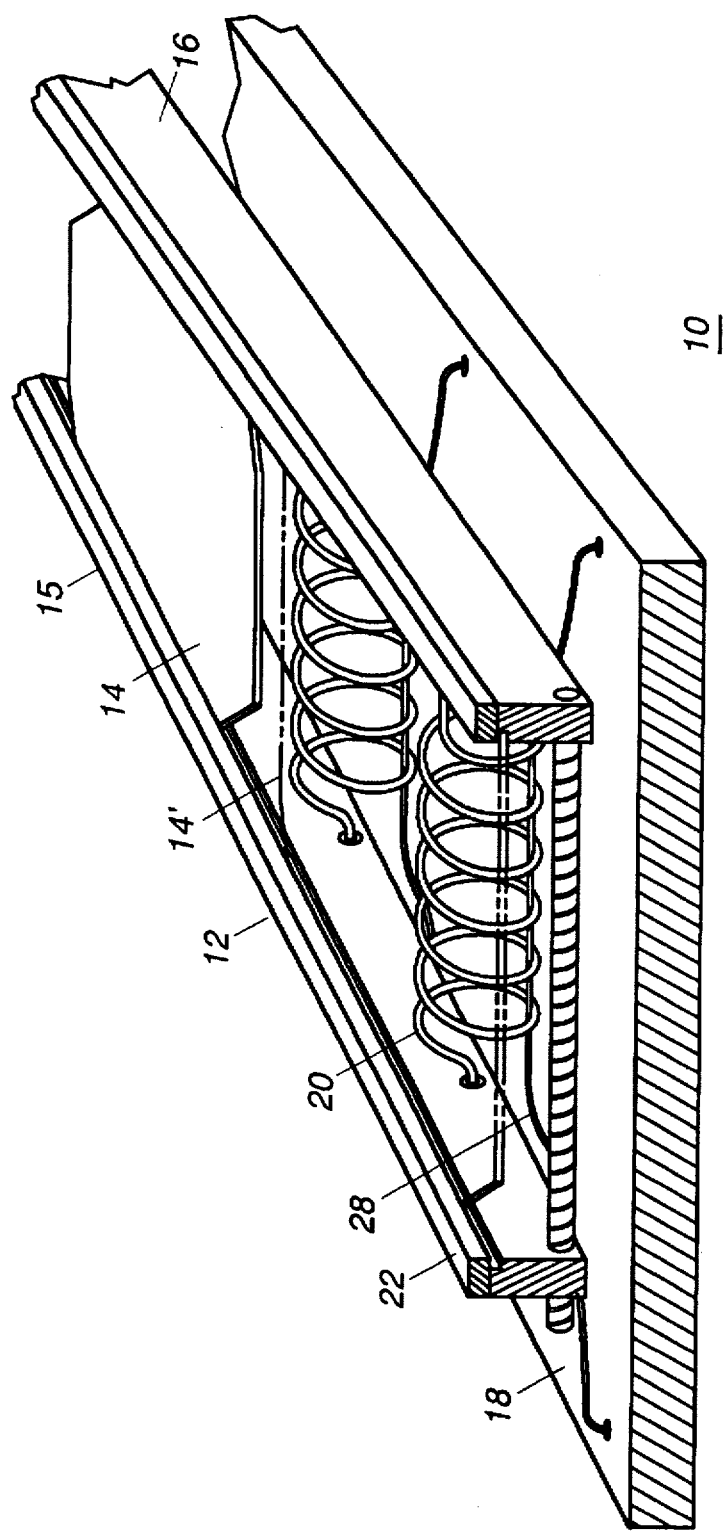
FIG. 1 is a perspective view of the support system for a printed circuit board in accordance with the invention.

While the specification concludes with claims defining the features of the invention that are regarded as novel, it is believed that the invention will be better understood from a consideration of the following description in conjunction with the drawing figures, in which like reference numerals are carried forward.

The preferred embodiment of the invention is designed to be used on high-speed placement machines such a chip shooters, that typically place small components such as chip resistors, chip capacitors, and inductors on printed circuit boards at very high rates. However, the invention is not intended to be so limited and will clearly find use on other automated machines such as robots, test equipment, fine pitch machines or printers for screening solder onto a printed circuit board.

A system of helically coiled air hoses supports a printed circuit board in an assembly station, and allows the conveyor rails to adjust in and out, accommodating various widths of printed circuit boards (PCB). Conveyor rails are used to transport the PCB within the assembly station and to locate and retain the PCB at a predetermined location. One of the conveyor rails is fixed and the other is movable. Air hoses are each formed in a helix and placed below the PCB and above the upper work surface of the assembly station, and arranged so that when the air hoses are pressurized the helix expands in diameter to become wedged between the work surface and the PCB to support it from below. One end of each of the air hoses is connected to the fixed rail and the other end is connected to the movable rail. The hoses are sufficiently flexible so as to be free to move about in a lateral direction, but they are diametrically rigid to prevent the diameter of each hose from changing substantially when the hoses are pressurized. The individual coils of the helix can be easily deflected by any protruding components on the bottom side of a printed circuit assembly as it shuttles into the assembly station. When the hoses are pressurized, the coils stiffen to support the PCB from the bottom. substantially preventing deformation of the PCB when a force is exerted upon it from above.

Referring now to FIG. 1, the support system 10 for a printed circuit board is situated in an assembly station or workstation. The workstation typically contains a transport mechanism 12 used to transport the printed circuit board 14 into and within the assembly station. The transport mechanism 12 may take a variety of forms, but in the preferred embodiment, the transport mechanism consists of two conveyor rails 15 and 16. One rail is a fixed rail (15) and the other rail is a movable rail (16). The moveable rail is designed to move inwardly and outwardly so as to accommodate printed circuit boards of varying widths. The movable rail 16 can be controlled manually or by electric motors, but in the preferred embodiment, is controlled by a microprocessor controller or other type of computer used in the auto assembly station. The auto assembly station also has a work surface 18 that lies below the conveyor rails and the printed circuit board.

The mechanism that supports printed circuit boards of varying sizes and varying topographic conditions is situated below the printed circuit board and above work surface 18. The support system consists of a plurality of plastic air hoses 20 that are coiled and then stretched to form a helix. Each of the air hoses 20 has one end attached to the fixed conveyor rail 15 and the other end attached to the movable conveyor rail 16. In the preferred embodiment, all of the hoses are connected into a single manifold such that they may all be pressurized at the same time. The air hoses are preferably made of a flexible material so that the length of the helix can be extended or compressed as the movable rail 16 moves out and in. However, it is desirable that the air hoses be made of a material that is sufficiently rigid so that when the air hoses are pressurized, for example, to approximately 80–150 psi, that the hose diameter does not change substantially.

In an alternate embodiment, a hose keeper 28 is optionally employed to hold the helical coils against the work surface. The hose keeper 28 is typically a wire or rubber strap threaded through the interior of the helical coil, and extending laterally across the work surface. The hose keeper is useful in situations where the two conveyor rails are relatively close to each other and the coils are relatively compact and, thus, may tend to move about in excess of what is desired. The hose keeper prevents the coils from rising too far above the work surface and interfering with the printed circuit board when it shuttles in and out of the assembly station.

Figure 3:
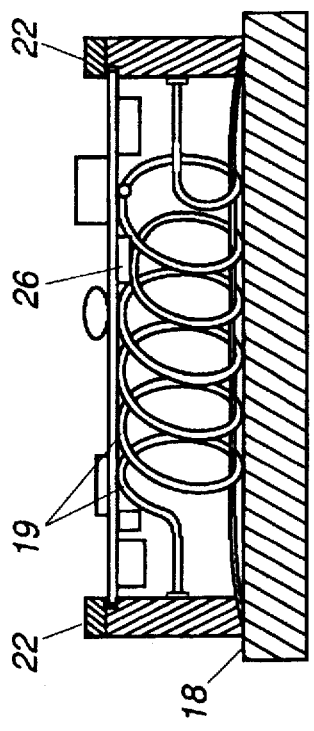
FIG. 3 is a front view of FIG. 1 when the support system is pressurized.
Figure 2:
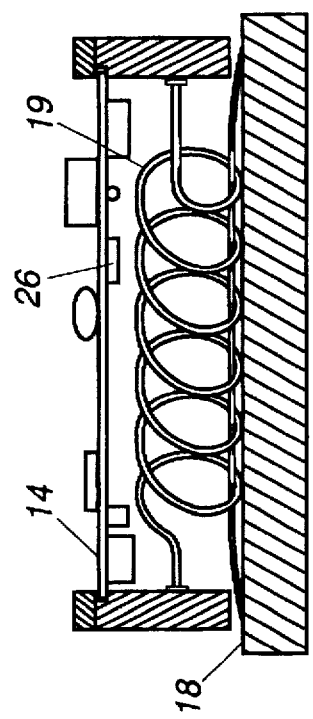
FIG. 2 is a front view of FIG. 1 when the support system is not pressurized.

Referring now to FIGS. 1 & 2, prior to the PCB 14 entering the assembly station, the hoses 18 are depressurized to near ambient pressure and are in a relaxed state. In this configuration, the hoses are compliant and the individual coils 19 of the helix can be easily deflected as the circuit board is shuttled into the station (represented in FIG. 1 where the PCB is shown in phantom lines as reference number 14 in position directly over the air hoses). The components 26 (if any) on the bottom side of the printed circuit board that protrude downwardly will strike the individual coils 19 of the helix and deflect those coils as the circuit board moves past them. Once the circuit board comes to a stop and is located at the predetermined location within the workstation, a restraining means 22, such as a clamp or top rail on a conveyor, is typically placed over the printed circuit board to hold it in place. At this point, the air hoses are then pressurized as shown in FIG. 3. Optionally, the work surface 18 may be raised upwards towards the conveyor rails to move the air hoses 20 closer to the PCB 14. This pressurization causes the helix to stiffen and the diameter of the helix increases somewhat. This action causes the air hoses 1 to become wedged between the bottom of the PCB 14 and the top of the assembly station work surface. Since the pressurized hoses are now rigid, they provide support to the underside of the printed circuit board. By placing a plurality of helically coiled hoses between the work surface and under the PCB, the PCB can be easily supported across its entire area. The component assembly process now takes place, wherein either the machine or an operator places components onto the top side of the printed circuit board. During this component placement, the rigidized helical coils in the air hoses prevent the downward deflection of the circuit board since the helical coils are stiffened by the internal air pressure. The restraining means 22 used to hold the printed circuit board in place in the assembly station serves to prevent upward movement of the printed circuit board when the air hoses are pressurized. At the end of the component assembly sequence, the air hoses are depressurized, now assuming their relaxed state, and the transport mechanism shuttles the assembled printed circuit board out of the workstation. Because the air hose is in a relaxed state, the individual coils can again deflect as protruding components on the bottom side of the circuit board bump into them during the exit stage.

Figure 4:
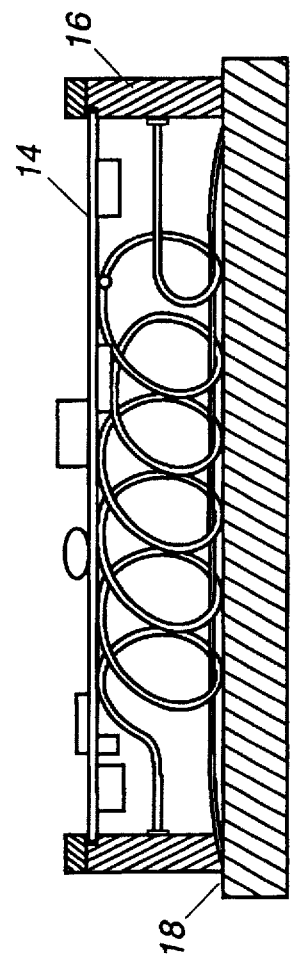
FIG. 4 is a front view of FIG. 1 when the transport means is moved to a wider position.

In the classical "batch of one" system where each printed circuit board is unique and can be of varying sizes and configurations, an automated system to accommodate the size changes must be provided. Referring now to FIG. 4, the movable rail 16 moves in and out to accommodate varying widths of the printed circuit board as it is shuttled into the assembly station. As the movable rail 16 moves outwardly, the length of the helix increases since one end of the helix is attached to the movable rail. Although the helix length increases, the diameter of the helix does not change substantially during this process. This is because the helically coiled air hoses, resembling a coil spring, can elongate in one direction with only minimal decrease in the diameter of the spring, as one skilled in the art of spring dynamics will readily appreciate. Once the movable rail has been relocated to the new position, the printed circuit board shuttles again into the workstation, the air hoses are pressurized, becoming rigid and wedging themselves between the circuit board and the work surface. Subsequent boards brought into the assembly station that may be narrower can also be processed when the movable rail is moved inwardly and the length of the helical coils is decreased.

In summary, components on the bottom side of the printed circuit board will cause some of the coils of the air hose to be deflected in one direction or another when the air hose is not in a pressurized state. Once the air hose is pressurized, the air hose stiffens and the diameter of the helix increase somewhat in order to wedge the air hose between the work surface and the bottom side of the printed circuit board. Because the air hose is flexible, it moves to accommodate the varying sized components on the bottom side of the printed circuit board. Printed circuit boards of varying length can be accommodated within this system and are supported simply by increasing the number of support hoses underneath the circuit board. By stretching or compressing the helix when the conveyor rails are moved in and out, printed circuit boards of a widely varying width can automatically be processed in the assembly station.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A system to support and accomodate printed circuit boards of varying sizes in an assembly station having an adjustable transport means, comprising:
   one or more flexible tubes formed in a helix having a length and a diameter, said flexible tubes situated below the printed circuit board and arranged so that when the tubes are pressurized above ambient they stiffen and contact the printed circuit board from below to support and substantially prevent deformation of the printed circuit board when a force is exerted upon the printed circuit board from above;

a retaining means located in the assembly station to hold the printed circuit board within the assembly station in a manner sufficient to prevent the printed circuit board from moving in an upwards direction when the flexible tubes are pressurized; and wherein the length of the helix changes when the width of the transport means is adjusted to accomodate a different size printed circuit board in the assembly station.

2. The system as described in claim 1, further comprising a work surface below the flexible tubes, the work surface situated such that when the flexible tubes are pressurized, the helix diameter increases to wedge the flexible tubes between the work surface and the printed circuit board.

3. The system as described in claim 1, further comprising a registration means to locate the printed circuit board at a predetermined location in the assembly station.

4. A system to support a printed circuit board in an assembly station having movable conveyor rails to accomodate printed circuit boards of varying width, comprising:

a fixed and a movable conveyor rail to transport the printed circuit board within the assembly station and to retain the printed circuit board at a predetermined location;

a plurality of air hoses that are sufficiently flexible to move in a lateral direction but are sufficiently rigid to prevent a diameter of each hose from substantially changing when the hoses are pressurized;

one end of each of the plurality of air hoses attached to the fixed conveyor rail and the other end attached to the movable conveyor rail;

a work surface below the plurality of air hoses; and each of the plurality of air hoses formed in a helix and situated below the printed circuit board and above the work surface, and arranged so that when the air hoses are pressurized the helix expands in diameter to become wedged between the work surface and the printed circuit board to support the printed circuit board from below, substantially preventing deformation of the printed circuit board when a force is exerted upon the printed circuit board from above.

5. The system as described in claim 4, wherein when the movable conveyor rail is moved outwardly to accommodate a wider printed circuit board, the helix is lengthened.

6. The system as described in claim 4, wherein the diameter of the helix remains substantially constant.

7. The system as described in claim 4, further comprising a restraining means to keep the air hoses in contact with the work surface.

8. The system as described in claim 4, wherein the work surface is moved closer to the printed circuit board when the air hoses are pressurized.

* * * * *